(12) United States Patent
Yoshikawa et al.

(10) Patent No.: US 8,062,425 B2
(45) Date of Patent: Nov. 22, 2011

(54) VAPOR DEPOSITION SYSTEM AND VAPOR DEPOSITION METHOD

(75) Inventors: Toshiaki Yoshikawa, Yokohama (JP); Naoto Fukuda, Funabashi (JP)

(73) Assignee: Canon Kabushiki Kaisha, Tokyo (JP)

( * ) Notice: Subject to any disclaimer, the term of this patent is extended or adjusted under 35 U.S.C. 154(b) by 1188 days.

(21) Appl. No.: 11/452,196

(22) Filed: Jun. 14, 2006

(65) Prior Publication Data
US 2006/0283382 A1 Dec. 21, 2006

(30) Foreign Application Priority Data

Jun. 20, 2005 (JP) .................................. 2005-179262

(51) Int. Cl.
*C23C 16/00* (2006.01)
(52) U.S. Cl. .................... 118/715; 156/345.33
(58) Field of Classification Search .................. 118/715; 156/345.33
See application file for complete search history.

(56) References Cited

U.S. PATENT DOCUMENTS

| | | | | |
|---|---|---|---|---|
| 5,083,590 A | * | 1/1992 | Gattolliat et al. | 137/870 |
| 5,635,408 A | * | 6/1997 | Sano et al. | 438/58 |
| 6,027,760 A | * | 2/2000 | Gurer et al. | 427/8 |
| 6,365,229 B1 | * | 4/2002 | Robbins | 427/248.1 |
| 6,379,747 B1 | * | 4/2002 | Sato | 427/248.1 |
| 2003/0155079 A1 | * | 8/2003 | Bailey et al. | 156/345.49 |
| 2004/0007176 A1 | * | 1/2004 | Janakiraman et al. | 118/715 |
| 2004/0074351 A1 | * | 4/2004 | Nitagai et al. | 82/124 |
| 2005/0217584 A1 | * | 10/2005 | Abiko et al. | 118/726 |
| 2006/0165892 A1 | * | 7/2006 | Weidman | 427/248.1 |

FOREIGN PATENT DOCUMENTS

| | | | |
|---|---|---|---|
| JP | 11-229123 | * | 2/1998 |
| JP | 2005-281808 | | 10/2005 |

OTHER PUBLICATIONS

Machine Translation from the Japanese Patent Office database of JPLO No. H11-229123.

* cited by examiner

*Primary Examiner* — Ram Kackar
*Assistant Examiner* — Satish Chandra
(74) *Attorney, Agent, or Firm* — Fitzpatrick, Cella, Harper & Scinto

(57) ABSTRACT

There is provided a device or a method including a flow path switching unit which switches a first flow path for releasing the vapor deposition material evaporated from a vapor depositing source from the same into a chamber, and a second flow path for causing the vapor deposition material evaporated from the vapor depositing source to flow from the vapor depositing source through a transfer path into a recovery container. The vapor deposition system or the vapor deposition method is capable of reducing an amount of a vapor deposition material consumed without being deposited on an object not to be processed during non-vapor deposition.

2 Claims, 7 Drawing Sheets

VAPOR DEPOSITION SYSTEM AND VAPOR DEPOSITION METHOD

BACKGROUND OF THE INVENTION

1. Field of the Invention

The present invention relates to a vapor deposition system used for forming a film of a vapor deposition material and a vapor deposition method therefor.

2. Related Background Art

A progress has recently been made in development of an organic electroluminescent (EL) element (OLED). Among organic materials used for the organic EL element, a film of an organic material constituted of a low molecular weight compound is formed mainly by vapor deposition. The vapor deposition is a method of forming a film by heating a vapor deposition material arranged in a vapor depositing source and sticking the evaporated vapor deposition material to an object to be processed.

Japanese Patent Application Laid-Open No. H11-229123 describes a vapor deposition system which includes a crucible for receiving a vapor deposition material, a vapor depositing source shutter, a vapor depositing material recovering tank, and a suction pipe. The vapor depositing source shutter is provided with a function of blocking a flow of the vapor deposition material evaporated from an opening of the crucible in a state of being separated by a few centimeters from above the opening, and configured not to interfere with an evaporation flow of the vapor deposition material in a state of being set in a position shifted from the opening. The position of the vapor depositing source shutter can be controlled by rotating and driving a rotary drive shaft, and flowing of the vapor deposition material evaporated from the crucible to a glass substrate can be permitted or blocked.

The vapor deposition system described in Japanese Patent Application Laid-Open No. H11-229123 can permit or block the flowing of the vapor deposition material evaporated from the crucible to the glass substrate by operating the vapor depositing source shutter. However, since the vapor depositing source shutter is separated from the crucible as described above, the evaporated vapor deposition material continues to leak into a film forming chamber from a separated area above the opening in this state.

The inventors have found that the described technical effects cannot be obtained by the vapor deposition system of Japanese Patent Application Laid-Open No. H11-229123. In other words, there is no big difference between a suction force of a suction pump and a suction force of a vacuum pump for suction in the film forming chamber. Further, the suction force of the suction pump is never much greater than that of the vacuum pump. To compare one end of the suction pipe, i.e., a suction port, with the area above the opening separated from the vapor depositing source shutter, the latter is substantially larger, and it is obvious that the material is not sucked into the suction pipe in most cases but released into the film forming chamber. Thus, the described technical effects cannot be obtained by the vapor deposition system described in Japanese Patent Application Laid-Open No. H11-229123.

SUMMARY OF THE INVENTION

It is therefore an object of the present invention to provide a vapor deposition system or a vapor deposition method which can reduce the amount of a vapor deposition material consumed more than necessary as a result of exiting from a vapor depositing source without continuous leakage of the vapor deposition material evaporated in the vapor depositing source into a chamber.

In order to attain the object, according to an aspect of the present invention, there is provided a vapor deposition system including: a chamber; a vapor depositing source; a recovery container; and a transfer path for connecting the vapor depositing source to the recovery container, in which the vapor deposition system further includes flow path switching means for switching a first flow path for releasing a vapor deposition material evaporated from the vapor depositing source into the chamber and a second flow path for causing the vapor deposition material evaporated from the vapor depositing source to flow from the vapor depositing source through the transfer path into the recovery container to each other, in which when the flow path switching means selects the second flow path, the vapor depositing source is sealed to the chamber by the flow path switching means.

In order to attain the object, according to another aspect of the present invention, there is provided a vapor deposition method for evaporating a vapor deposition material set in a vapor depositing source to be deposited on an object to be processed in a chamber, including: a vapor deposition material releasing step of releasing the vapor deposition material evaporated from the vapor depositing source from the same into the chamber; and a vapor deposition material recovering step of causing the vapor deposition material evaporated from the vapor depositing source to flow from the vapor depositing source through a transfer path into a recovery container, in which the vapor depositing source is sealed to the chamber during the vapor deposition material recovering step.

According to the present invention, the vapor deposition material evaporated in the vapor depositing source never continues to leak into the chamber. Hence, it is possible to reduce the amount of a vapor deposition material consumed more than necessary as a result of exiting into the chamber.

DESCRIPTION OF THE PREFERRED EMBODIMENTS

Figure 1:
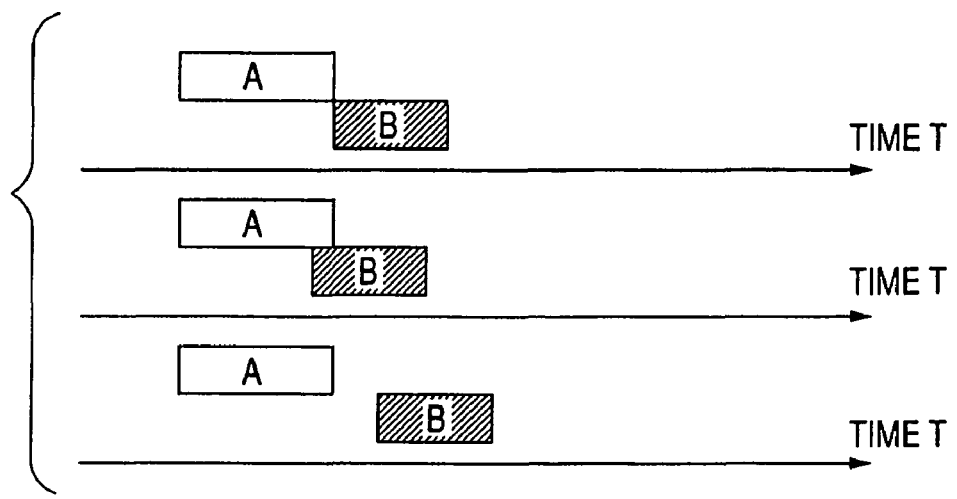
FIG. 1 is a diagram showing a time relation between a vapor deposition material releasing step and a vapor deposition material recovering step of a vapor deposition method of the present invention.

First, a vapor deposition system of the present invention will be described.

The vapor deposition system according to the present invention includes flow path switching means for switching a first flow path for releasing a vapor deposition material evaporated from the vapor depositing source into the chamber and a second flow path for causing the vapor deposition material evaporated from the vapor depositing source to flow from the vapor depositing source through the transfer path into the recovery container to each other. When the flow path switching means selects the second flow path, the first flow path is sealed by the flow path switching means.

The vapor depositing source has a space to receive the evaporated vapor deposition material before it is released into the chamber. One of the first and second flow paths is selected by the flow path switching means to enable setting of one in a state in which fluids (evaporated vapor deposition material) flow and the other in a state in which the fluids do not flow. More specifically, when the flow path switching means selects the second flow path, the first flow path is sealed.

The sealing shows a state in which the flow path is blocked to prevent leakage of the fluids to a release destination. The sealing of the first flow path prevents continuous leakage of the evaporated vapor deposition material into the chamber when it is recovered into the recovery container. As a result, it is possible to reduce the amount of a vapor deposition material released into the chamber to be consumed without being deposited on an object to be processed.

The recovery container is provided to recover the vapor deposition material evaporated without being used for forming a film by preventing its releasing into the chamber. By the recovery container, the vapor deposition material released from the vapor depositing source is not stored in the chamber unnecessarily by a great amount. As a result, it is possible to prevent an alteration of the vapor deposition material stored in the chamber, such as decomposition of a great amount caused by a high temperature in the chamber.

When the evaporated vapor deposition material flows into the recovery container without being used for forming a film, the vapor deposition material is guided through the transfer path into the recovery container. For example, the transfer path is constituted of a hollow member such as a pipe, and the fluids can path through the hollow portion.

Next, a vapor deposition method of the present invention will be described.

The vapor deposition method of the present invention includes a vapor deposition material releasing step of releasing the vapor deposition material evaporated from the vapor depositing source from the same into the chamber, and a vapor deposition material recovering step of causing the vapor deposition material evaporated from the vapor depositing source to flow from the vapor depositing source through the transfer path into the recovery container. The vapor depositing source is sealed to the chamber during the vapor deposition material recovering step. As the vapor depositing source is sealed to the chamber during the vapor depositing material recovering step, the vapor deposition material evaporated from the vapor depositing source never continues to leak into the chamber. As a result, it is possible to reduce the amount of a vapor deposition material released into the chamber to be consumed without being deposited on the object to be processed.

For example, the vapor deposition releasing step is a step from a time when the vapor deposition material evaporated in the vapor depositing source to be released to the outside starts to adhere to the object arranged in the chamber to be processed to a time when the adhesion of the vapor deposition material to the object is completed. For example, the time when the vapor deposition material starts to adhere to the object to be processed is a time when a shutter disposed in the midway of flying of the vapor deposition material evaporated in the chamber toward the object to be processed retreats from the midway to no more cover the object to be processed. For example, the time when the adhesion of the vapor deposition material to the object to be processed is completed is a time when the shutter enters the midway to cover the object to be processed. For example, the vapor deposition material recovering step is a step from a time when the vapor depositing source and the recovery container are conducted to each other to a time when they are cut off from each other.

FIG. 1 shows three time relations between the vapor deposition material releasing step and the vapor deposition material recovering step. In FIG. 1, A denotes a time of the vapor deposition material releasing step, and B denotes a time of the vapor deposition material recovering step. For the vapor deposition method of the present invention, any one of the three shown in FIG. 1 can be applied. The upper portion of the drawing is a case in which the vapor deposition material recovering step B is started simultaneously with a completion of the vapor deposition material releasing step A. The middle portion of the drawing is a case in which the vapor deposition material releasing step A and recovering step B are partially carried out at the same time. The lower portion of the drawing is a case in which the vapor deposition material B is started a certain time after completion of the vapor deposition releasing step A.

FIG. 1 shows three timings for changing from the vapor deposition material releasing step A to the vapor deposition material recovering step B. However, according to the present invention, when the process changes from the vapor deposition material recovering step B to the vapor deposition material releasing step A, any one of the three of the drawing in which A and B are reversed may be employed.

The preferred embodiments of the present invention will be described below with reference to the drawings. It should be noted, however, that the embodiments are in no way limitative of the present invention.

First Embodiment

A vapor deposition system of this embodiment includes flow path switching means for switching a first flow path for releasing a vapor deposition material evaporated from a vapor depositing source from the same into a chamber, and a second path for causing the vapor deposition material evaporated from the vapor depositing source to flow from the vapor depositing source through a transfer path into a recovery container to each other. When the flow path switching means selects the second flow path, the first flow path is sealed by the flow path switching means.

Figure 2:
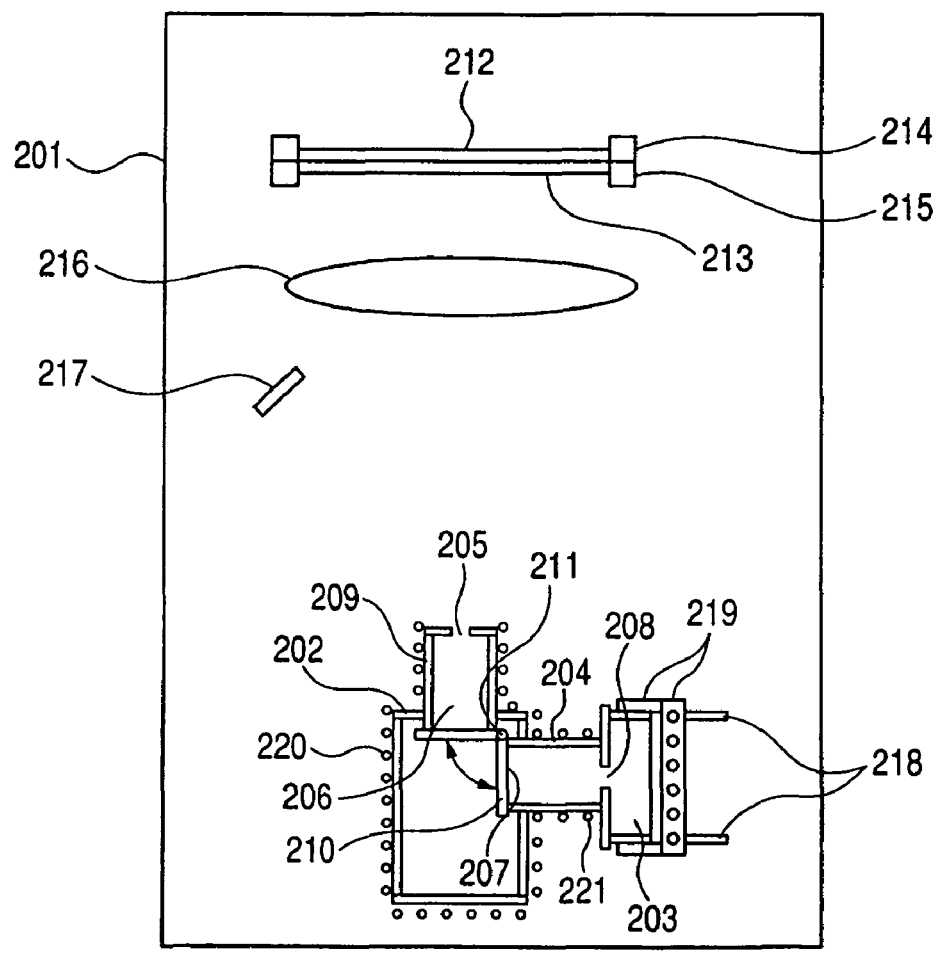
FIG. 2 is a schematic diagram of a vapor deposition system according to a first embodiment of the present invention.

FIG. 2 is a schematic diagram showing the vapor deposition system of the embodiment. In FIG. 2, 201 is a chamber, 202 is a vapor depositing source, 203 is a recovery container, 204 is a transfer path, 205 is a release port, 206 is an opening, 207 is a vapor deposition material inlet, 208 is a recovery container opening, 209 is a vapor depositing source upper portion, 210 is a cover, 211 is a shaft, 212 is a substrate, 213 is a mask, 214 is a substrate holder, 215 is a mask holder, 216 is a shutter, 217 is a crystal resonator film thickness sensor, 218 is a pipe, 219 is cooling means, 220 is a heater, and 221 is transfer path heating means.

The vapor depositing source 202 in which a vapor deposition material (not shown) is set receives an evaporated vapor deposition material before it is released into the chamber 201. The transfer path 204 is disposed in a side wall of the vapor depositing source 202, and the vapor depositing source 202 and the recovery container 203 are conducted to each other through the transfer path 204. The cover 210 rotated around the shaft 211 is disposed in the vapor depositing source 202. This cover 210 serves as the flow path switching means. By rotating the cover 210, one of the opening 206 and the vapor deposition material inlet 207 can be covered. The opening 206 is disposed in the vapor depositing source 202. The vapor deposition inlet 207 is one end of the transfer path 204. Note that, the opening 206 and the vapor deposition material inlet 207 are larger in aperture area than the release port 205.

When the cover 210 covers the vapor deposition material inlet 207, the vapor depositing source 202 and the recovery container 203 are cut off from each other, and the vapor deposition material heated in the vapor depositing source 202 is released into the chamber 201. When the cover 210 covers the opening 206, the vapor depositing source 202 and the recovery container 203 are conducted to each other, and the vapor deposition material heated in the vapor depositing source 202 flows into the recovery container 203. In this case, the vapor deposition material does not leak into the chamber 201, and the vapor depositing source 202 is sealed to the chamber 201. Thus, according to the embodiment, this case can be applied during, e.g., non-vapor deposition.

The vapor deposition material that has flown into the recovery container 203 is cooled, and liquefied or solidified to be stored in the recovery container 203. The vapor depositing source 202 is disposed in a lower portion of the chamber 201. The heater 220 is disposed to heat the vapor depositing source 202. According to the embodiment, the heater 220 spirally surrounds the vapor depositing source 202 from the outside.

The vapor deposition material heated to be evaporated in the vapor depositing source 202 exits from the opening 206, and is released from the release port 205 disposed in the vapor depositing source upper portion 209 into the chamber 201 to form a film on the substrate 212 which is an upper object to be processed. This shows an example in which the evaporated vapor deposition material exits from the opening 206 of the vapor depositing source 202 to be released into the chamber 201, thereby forming a film on the substrate 212 of the chamber 201.

The substrate 212 is held by the substrate holder 214. The mask 213 is provided to form a film by patterning the vapor deposition material on a surface of the substrate 212, and held in a state of being adjusted for position with respect to the substrate 212 by the mask holder 215. The shutter 216 retreats from a portion between the vapor deposition material and the substrate 212 by driving means (not shown) during vapor deposition. A speed of the vapor deposition is observed by the crystal resonator film thickness sensor 217.

The non-vapor deposition time is a time when a film of a vapor deposition material is not formed on the substrate, e.g., a starting/finishing time of the vapor deposition system, a substrate changing time, or the like.

More specifically, the starting time of the vapor deposition system is a time from a heating start of the vapor depositing source 202 to permission of releasing of the vapor deposition material from the vapor depositing source 202 into the chamber 201, or to a film forming start on the substrate 212.

More specifically, the finishing time of the vapor deposition system is a time from a heating stop of the vapor depositing source 202 to a stop of releasing of the vapor deposition material from the vapor depositing source 202 into the chamber, or to an evaporation stop of the vapor deposition material.

More specifically, the substrate changing time is a time until the film-formed substrate 212 is changed to another substrate (not shown) to start film formation thereon.

In the vapor deposition system of the embodiment, preferably, conductance until the vapor deposition material evaporated from the vapor depositing source 202 is released in the chamber 201 and conductance until the vapor deposition material evaporated from the vapor depositing source 202 is recovered in the recovery container 203 should be equal to each other. The vapor depositing source upper portion 209 is provided in the vapor depositing source 202 to make one conductance equal to another. The release port 205 is provided in the vapor depositing source upper portion 209. A shape and an aperture area of the release port 205 are equal to those of the recovery container opening 208. Additionally, according to the embodiment, a sectional shape, a sectional area, and a length of the vapor depositing source upper portion 209 are equal to those of the transfer path 204. As a result, the first and second flow paths are equal to each other in conductance.

Figure 3:
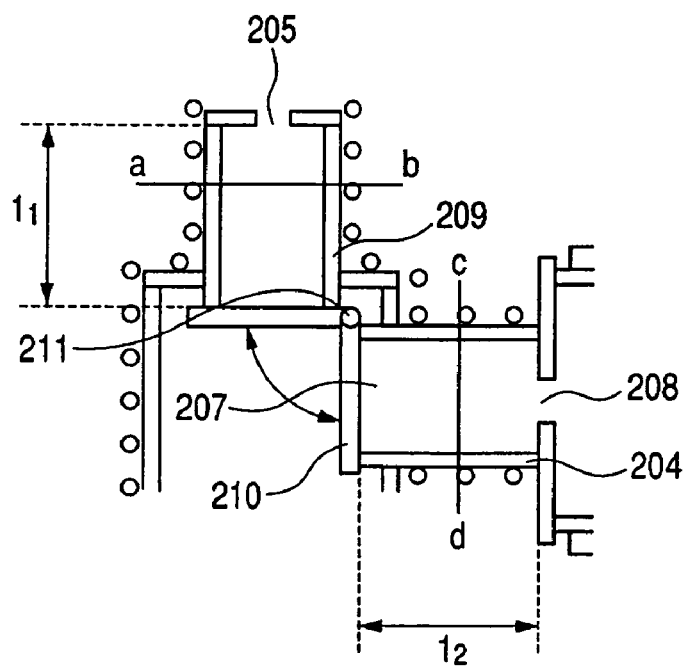
FIG. 3 is a schematic diagram showing flow path switching means of the vapor deposition system according to the first embodiment of the present invention.

As shown in FIG. 3, the sectional shape and the sectional area of the vapor depositing source upper portion 209 are those cut on the a-b line which is a plane vertical to the vapor depositing source upper portion 209. As shown in FIG. 3, the length of the vapor depositing source upper portion 209 is a distance 11 between both ends of the vapor depositing source upper portion 209. Similarly, the sectional shape and the sectional area of the transfer path 204 are those cut on the c-d line, and the length of the transfer path 204 is a distance $1_2$ between both ends of the transfer path 204. In the drawings below, the same numerals as those of FIG. 2 denote the same members.

The conductance is an inverse number of flow resistance, i.e., a value indicating flow easiness of fluids. The conductance until the vapor deposition material evaporated from the vapor depositing source 202 is released into the chamber 201 is decided by the shape and the aperture area of the release port 205 and the sectional area and the length of the vapor depositing source upper portion 209. The conductance until the vapor deposition material evaporated from the vapor deposition source 202 is recovered in the recovery container 203 is decided by the shape and the aperture area of the recovery container opening 208 and the sectional area and the length of the transfer path 204. As the shape and the aperture area of the release port 205 are equal to those of the recovery container opening 208, and the sectional area and the length of the vapor depositing source upper portion 209 are equal to those of the transfer path 204, the first and second flow paths are equal to each other in conductance. It is not always necessary to set the vapor depositing source upper portion 209 and the transfer path 204 to be equal to each other in sectional shape.

Thus, by setting the first and second flow paths to be equal in conductance, when the cover 210 is rotated to switch the flow paths, it is possible to prevent improper vigorous releasing of the vapor deposition material from the release port 205 into the chamber 201. If flow paths are different from each other in conductance, when the flow path of large conductance is switched to the flow path of small conductance, there is a possibility of the improper vigorous releasing of the vapor deposition material into the chamber 201 because of a sudden increase in pressure. For example, a vapor deposition speed is not stabilized from the time of the improper vigorous releasing of the vapor deposition material into the chamber 201 to a time when the releasing becomes stable, inhibiting film formation on the substrate 212. Thus, useless consumption of the vapor deposition material increases. In other words, by making conductance equal to another, it is possible to suppress useless consumption of the vapor deposition material.

According to the embodiment, the flow path is changed to another by rotating one cover 210. Thus, a fluctuation in pressure becomes smaller whereby a sudden increase in the released amount of a vapor deposition material can be suppressed. In the case of changing the flow path to another by rotating the cover 210, the opening 206 and the vapor deposition material inlet 207 are both opened in a period of changing from a state in which one of the opening 206 and the vapor deposition material inlet 207 is covered to a state in which the other is covered. As a result, a pressure difference is not so large between the inside and the outside of the vapor depositing source 202.

As shown in FIG. 2, the vapor deposition system of the embodiment should preferably include the transfer path heating means 221 for heating the transfer path 204. It is because adhesion of the vapor deposition material in the transfer path 204 can be prevented by heating the transfer path 204. For example, for the transfer path heating means 221, a heater having a heating wire wound on the transfer path 204 may be used.

As shown in FIG. 2, the vapor deposition material of the embodiment should more preferably include the cooling means 219 for cooling the recovery container 203. The presence of the cooling means 219 assures solidification of the vapor deposition material. In FIG. 2, as an example of the cooling means 219, a water-cooling jacket is installed which executes cooling by cooling water supplied/released through the pipe 218.

In the vapor deposition system of the embodiment, the vapor depositing source 202 should preferably be a cylindrical member. It is because a cylindrical shape enables uniform heating of the vapor deposition material.

In the vapor deposition system of the embodiment, the substrate 212 should preferably be disposed in a position isotropic to the release port 205. It is because a more uniform film can be formed on the surface of the substrate 212 by arranging it in the position isotropic to the release port 205.

In the vapor deposition system of the embodiment, the heater 220 may be a heater having a heating wire wound to surround an outer wall of the vapor depositing source 202 as shown in FIG. 2, or a lamp light source for heating by applying an infrared ray.

In the vapor deposition system of the embodiment, the cover 210 should preferably be a flat-plate member. It is because the opening 206 or the vapor deposition material inlet 207 can be more easily and surely sealed by bringing the flat-plate member larger in area into contact with it.

In the vapor deposition system of the embodiment, the single cover 210 serves as the flow path switching means for switching the first flow path for releasing the vapor deposition material evaporated from the vapor depositing source 202 into the chamber 201 and the second flow path for causing the vapor deposition material to flow into the recovery container 203 to each other. Different from the case of the embodiment, flow path switching means constituted of a plurality of covers may be used. In this case, a cover for controlling the releasing of the vapor deposition material into the chamber 201, and a cover for controlling the flowing of the vapor deposition material into the recovery container 203 may be respectively disposed.

The vapor deposition system of the embodiment may include a plurality of groups each including the vapor depositing source 202, the recovery container 203, and the transfer path 204. For example, when a plurality of vapor deposition materials are codeposited, by setting the vapor deposition materials in different vapor depositing sources and heating the vapor depositing sources to an optimal temperature, it is possible to form a film having a plurality of vapor deposition materials mixed therein on the substrate 212.

The vapor deposition system of the embodiment may include a plurality of release ports in a direction parallel to the surface of the substrate 212, and at least one releasing means (not shown) for receiving the vapor deposition material evaporated from the vapor depositing source 202 and releasing it through the release port. For example, the releasing means is a container having a plurality of release ports on a surface parallel to the surface of the substrate 212. The vapor deposition material evaporated from the vapor depositing source 202 first flows into the releasing means, and is released from the plurality of release ports after passage through the releasing means. The presence of the plurality of release ports enables more uniform formation of a film on the surface of the substrate 212.

The vapor deposition system of the embodiment may include position varying means for changing relative positions of the substrate 212 and the release port (not shown). For example, the position varying means is a conveyor for horizontally moving the substrate 212. When the position varying means moves the substrate 212, a similar film forming process is carried out in positions along a moving direction of the surface of the substrate 212. Accordingly, a film can be more uniformly formed on the surface of the substrate 212. When the position varying means moves the substrate 212, it can be carried out continuously with conveying of the substrate 212 into or out of the chamber 201. Thus, a tact time can be shortened. This vapor deposition system is useful for, for example, vapor deposition on a large substrate having a diagonal angle of about 20 inches or more. Alternatively, when a film is formed on a small substrate by using this vapor deposition system, for example, mass production is enabled by arraying a plurality of substrates in a large substrate tray to constitute a large substrate and to form a film thereon.

The vapor deposition system of the embodiment is not limited to the above configuration. For example, the vapor deposition system may not include the cooling means 219 for cooling the recovery container 203. Even without the cooling means 219, a temperature of the recovery container 203 becomes lower than that of the vapor depositing source 202 unless the vapor depositing source 202 is heated, and hence the vapor deposition material can be solidified.

Next, a vapor deposition method carried out by using the vapor deposition system of the embodiment will be described.

The vapor deposition method of the embodiment includes a vapor deposition material releasing step of releasing the vapor deposition material evaporated from the vapor depositing source from the same into the chamber, and a vapor deposition material recovering step of causing the vapor deposition material evaporated from the vapor depositing source to flow from the vapor depositing source through the transfer path into the recovery container. During the vapor deposition recovering step, the vapor depositing source is sealed to the chamber.

Figure 4:
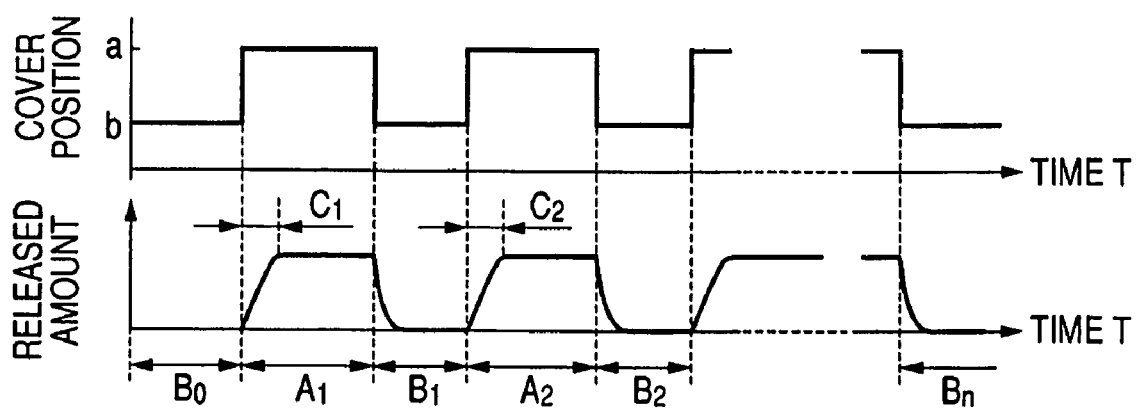
FIG. 4 is a diagram showing a relation between an opening/closing operation of the flow path switching means of the vapor deposition method and a released amount according to the first embodiment of the present invention.

Regarding the vapor deposition method of the embodiment, FIG. 4 is an explanatory diagram of changes over time in the opening/closing timing of the opening 206 shown in FIG. 2 and the released amount of the vapor deposition material. In FIG. 4, the upper portion shows positions of the cover 210. In the upper portion, when the cover 210 covers the vapor deposition material inlet 207, the position of the cover 210 is a. When the cover 210 covers the opening 206, the position of the cover 210 is b. In FIG. 4, the lower portion shows the released amount of a vapor deposition material released from the release port 205. In the drawing, A denotes the vapor deposition material releasing step, and B denotes the vapor deposition material recovering step. In this case, the upper portion of FIG. 1 is shown.

Referring to FIG. 4, the changes over time in the opening/closing timing of the opening 206 and the released amount of the vapor deposition material will be described.

First, the vapor deposition system is started ($B_0$). Heating of the vapor deposition material received in the vapor depositing source 202 is started, and the vapor deposition material is heated until it is stabilized at a desired temperature. During the starting, the cover 210 covers the opening 206, and the vapor depositing source 202 is in a state of being sealed to the chamber 201. Accordingly, the evaporated vapor deposition material is not released into the chamber. On the other hand, since the vapor deposition material inlet 207 is opened, the evaporated vapor deposition material flows through the transfer path 204 into the recovery container 203, and cooled again to be deposited in the recovery container 203.

Next, vapor deposition is carried out on the substrate 212 ($A_1$). During this period, the cover 210 is rotated to cover the vapor deposition material inlet 207, while the opening 206 is opened. The vapor deposition material heated in the vapor depositing source 202 is released into the chamber 201. The released amount of a vapor deposition material gradually increases after the opening 206 is opened, and it takes time for the released amount to be stabilized ($C_1$, $C_2$, . . . in the drawing).

Then, the vapor deposition on the substrate 212 is finished, and the vapor deposition material flows again into the recovery container 203 ($B_1$). During this period, the cover 210 is rotated to cover the opening 206, while the vapor depositing source 202 is sealed to the chamber 201. On the other hand, the vapor deposition material inlet 207 is opened. During this period, the vapor depositing source 202 is continuously heated, and the vapor deposition material evaporated in the vapor depositing source 202 flows through the transfer path 204 into the recovery container 203. As the vapor deposition material remains in the vapor depositing source upper portion 209 even after the opening 206 is covered, it takes time until this vapor deposition material is released and the releasing stops. After the releasing of the vapor deposition material left in the vapor depositing source upper portion 209, no vapor deposition material is released any more. The substrate 212 is changed to another substrate (not shown) during $B_1$ or simultaneously.

Next, the cover 210 is rotated again, and the vapor deposition is started on another substrate ($A_2$). When the vapor deposition is finished, the cover 210 is rotated to cause the vapor deposition material to flow into the recovery container ($B_2$). Similar steps $A_3$, $B_3$, $A_4$, $B_4$ . . . are repeated thereafter.

Lastly, after the vapor deposition material releasing step has been carried out by n times, the vapor deposition system is stopped ($B_n$). The cover 210 is rotated to cover the opening 206, while the vapor deposition material inlet 207 is opened. During the period of $B_n$, the heating of the vapor depositing source 202 is suspended. The vapor deposition material continues to evaporate for a while, and the evaporated vapor deposition material flows into the recovery container 203. Subsequently, the temperature of the vapor deposition material in the vapor depositing source 202 gradually declines to stop the evaporation.

The inventors of the present invention have found that the maximum released amount of the vapor deposition material is small because the cover 210 is rotated to open/close the opening 206 and the vapor deposition material inlet 207 according to the vapor deposition method of the embodiment. Thus, the vapor deposition can be carried out on the substrate 212 as soon as the opening 206 is opened. In other words, film formation can be carried out even during the periods of C. It is because neither of the opening 206 nor the vapor deposition material inlet 207 is closed in the case of switching the flow path to another according to the vapor deposition method of the embodiment. In the case where the opening 206 and the vapor deposition material inlet 207 are both closed in the case of switching the flow path to another, when the opening 206 is opened after the closed state of both, the vapor depositing source 202 is filled with the evaporated vapor deposition material to set a pressurized state in the vapor depositing source 202. Subsequently, when a portion between the vapor depositing source 202 and the chamber 201 is opened, the released amount of a vapor deposition material suddenly increases. In other words, according to the vapor deposition method of the embodiment, as neither of the opening 206 nor the vapor deposition material inlet 207 is closed, a pressure difference is not so large between the inside and the outside of the vapor depositing source 202.

Figure 5:
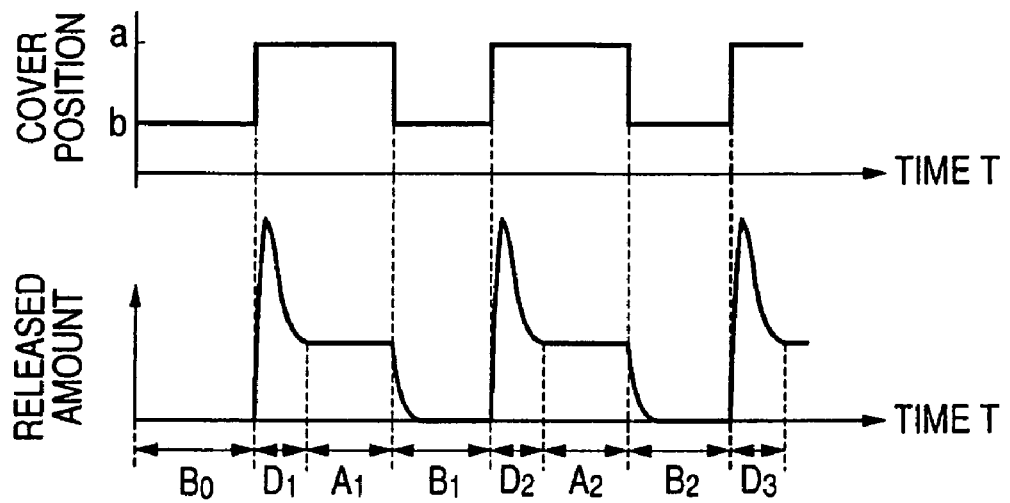
FIG. 5 is a diagram showing a relation between an opening/closing operation of flow path switching means and a released amount according to a reference example of the first embodiment of the present invention.

As a reference example, FIG. 5 shows a time flow when the opening 206 and the vapor deposition material inlet 207 are both closed, for example, in the case of switching the flow path to another. It can be understood from the drawing that the released amount of a vapor deposition material suddenly increases as soon as the portion between the vapor depositing source 202 and the chamber 201 is opened (immediately after the steps B). Subsequently, it takes time until stabilization at a fixed released amount ($D_1$, $D_2$, $D_3$, . . . ). It is not preferable to stick the vapor deposition material released during this period on the substrate 212 which is an object to be processed. In other words, film formation is not permitted during the periods of D. It is because of a possibility of a change in film quality if the vapor deposition material released during the sudden increase of the released amount adheres to the substrate 212. There is a possibility of incursion of a vapor deposition material released as a solid in the vapor deposition material released during the sudden increase of the released amount. As a crystal particle diameter of the solid vapor deposition material may greatly vary, once it adheres to the substrate 212, there is a possibility that film uniformity will not be maintained. In FIG. 5, the released amounts of D1, D2, . . . are shown to be equal. However, because of a possibility of a variance on released amounts, it is difficult to predict the vapor deposition material released during each period, and therefore each of the periods of D is difficult to be utilized for forming a film. For this reason, it is not preferable to stick the vapor deposition material released during the sudden increase of the released amount to the substrate 212.

According to the vapor deposition method of the embodiment, the vapor deposition material releasing step and the vapor deposition material recovering step are carried out by a plurality of times as shown in FIG. 4. However, these steps do not need to be executed by a plurality of times, but may be used for vapor deposition carried out only once. When these steps are carried out by a plurality of times, it is possible to perform a vapor deposition process on many substrates.

According to the vapor deposition method of the embodiment, the vapor deposition material disposing steps A and the vapor deposition material recovering steps B are respectively equal to each other in periods of time ($A_1=A_2=\ldots$, $B_1=B_2=\ldots$) as shown in FIG. 4. However, the periods of time do not need to be equal. For example, when a film thickness or a vapor deposition material varies, the periods of times of the vapor deposition releasing steps ($A_1, A_2, \ldots$) may be changed.

According to the vapor deposition method of the embodiment, the released amounts of vapor deposition materials are equal to one another in the vapor deposition material releasing steps A as shown in FIG. 4. However, the released amounts of vapor deposition materials in the steps do not need to be equal.

According to the vapor deposition method of the embodiment, each of the vapor deposition material releasing steps A is started simultaneously with each end of the vapor deposition material recovering steps B. However, each of the vapor deposition material releasing steps A may be started a certain time after each end of the vapor deposition material recovering steps B. In this case, the shutter 216 should preferably enter the portion between the substrate 212 and the release port 205 to cover the substrate 212. Accordingly, it is possible to prevent adhesion of a vapor deposition material to the object to be processed during a period from each end of the vapor deposition recovering steps B to each start of the vapor deposition material releasing steps A.

The vapor deposition method of the embodiment can be suitably used for forming an organic layer which constitutes an organic EL element or an organic EL element array constituted of a plurality of organic EL elements. More specifically, the organic layer means a layer made of an organic compound arranged between a pair of electrodes. As an organic EL material is generally expensive, it is possible to reduce manufacturing costs by recovering it for reuse. Moreover, the organic EL element array can be used as a display portion of the display.

Second Embodiment

In a vapor deposition system of this embodiment, flow path switching means is a three-way valve.

Figure 6:
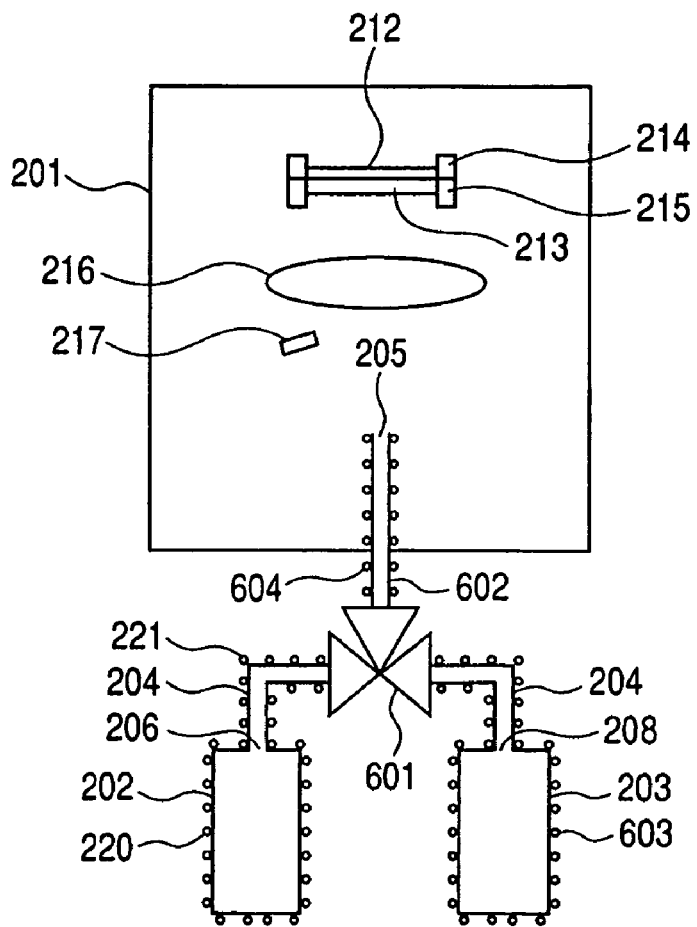
FIG. 6 is a schematic diagram showing a vapor deposition system according to a second embodiment of the present invention.

FIG. 6 is a schematic diagram showing the vapor deposition system according to the embodiment. In FIG. 6, 601 is a three-way valve which is the flow path switching means, 602 is a pipe, 603 is recovery container heating means, and 604 is pipe heating means. The components similar to those of FIG. 2 are denoted by similar reference numerals, and description thereof will be omitted.

A vapor depositing source 202 stores a vapor deposition material (not shown), and releases the vapor deposition material into a chamber 201. A transfer path 204 is provided above the vapor depositing source 202 to interconnect an opening 206 and a recovery container opening 208. The vapor depositing source 202 and a recovery container 203 are conducted to each other through the transfer path 204. The three-way valve 601 is provided in a midway of the transfer path 204. Two of three directions of the three-way valve are each communicated with the transfer path 204, and the other is communicated with the pipe 602. The other end of the pipe is communicated with the chamber 201.

Three flow paths can be switched by opening/closing the three-way valve 601. A first flow path is a path in which the vapor depositing source 202 and the chamber 201 are conducted to each other to block entrance into the recovery container 203 (flow path (1)). A second flow path is a path in which the vapor depositing source 202 and the recovery container 203 are conducted to each other to block entrance into the chamber 201, and the vapor depositing source 202 is sealed to the chamber 201 (flow path (2)). A third flow path is a path in which the recovery container 203 and the chamber 201 are conducted to each other to block entrance into the vapor depositing source 202 (flow path (3)).

In the case of the flow path (1), a vapor deposition material heated in the vapor deposition source 202 can be released into the chamber 201. In the case of the flow path (2), the vapor deposition material can flow into the recovery container 203.

As the vapor depositing source 202 and the recovery container 203 are sealed to the chamber 201, continuous leakage of the vapor deposition material evaporated in the vapor depositing source 202 or the recovery container 203 into the chamber 201 is prevented. The flow path (3) can be used when the vapor deposition material that has flown from the vapor depositing source 202 into the recovery container 203 to be deposited is released into the chamber 201.

In the vapor deposition system of the embodiment, especially the vapor depositing source 202 should preferably be provided outside the chamber 201. By providing the vapor depositing source 202 outside the chamber 201, it is possible to install a vapor depositing source of a large capacity. Accordingly, a great amount of a vapor deposition material is stored in the vapor depositing source of the large capacity to enable vapor deposition on more objects to be processed. The presence of the vapor depositing source 202 outside the chamber 201 facilitates replenishment or replacement of the vapor deposition material in the vapor depositing source 202.

In the vapor deposition system of the embodiment, the recovery container 203 and the transfer path 204 should preferably be provided outside the chamber 201. The presence of the recovery container 203 and the transfer path 204 outside the chamber 201 facilitates replacing or cleaning of the recovery container 203 and the transfer path 204.

The vapor deposition system of the embodiment should preferably include the recovery container heating means 603 for heating the recovery container 203. In the case of the flow path (3), the vapor deposition material that has flown from the vapor depositing source 202 into the recovery container 203 can be deposited on the object to be processed by heating it to evaporate. In other words, the recovery container 203 can be used as a vapor depositing source. When the recovery container 203 is used as a vapor depositing source, the vapor depositing source 202 can be used as a recovery container. In this case, moreover, the vapor deposition system of the embodiment should preferably include cooling means (not shown) for cooling the vapor depositing source 202. The cooling means assures solidification of, e.g., a vapor deposition material of a low boiling point which has flown from the recovery container 203 into the vapor depositing source 202.

The other components should preferably be similar to those of the vapor deposition system of the first embodiment.

Next, a vapor deposition method of the embodiment will be described. In addition, a vapor deposition method when the recovery container 203 is used as a vapor depositing source will be described.

Figure 7:
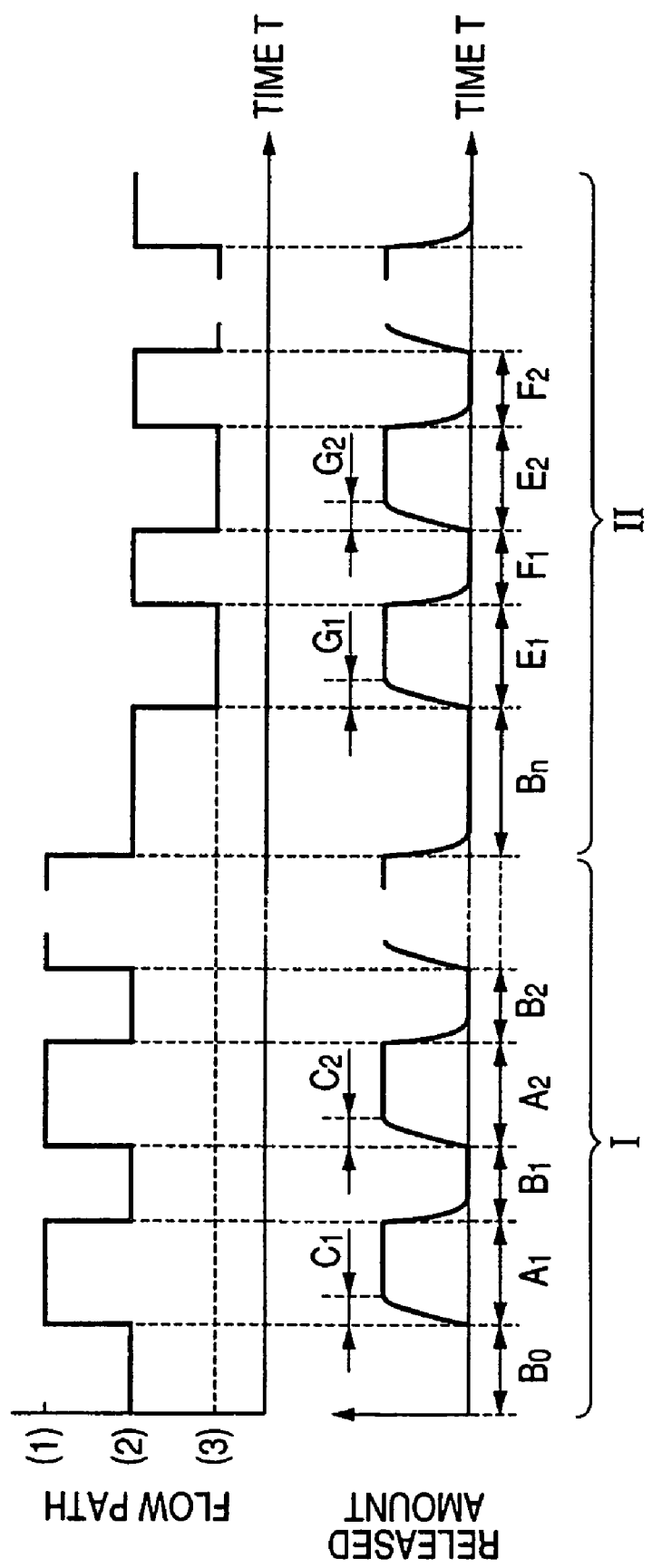
FIG. 7 is a diagram showing a relation between an opening/closing operation of flow path switching means and a released amount according to a vapor deposition method according to the second embodiment of the present invention.

Regarding the vapor deposition method of the embodiment, FIG. 7 is an explanatory diagram showing changes over time in switching timing of the three-way valve and the released amount of a vapor deposition material. In FIG. 7, the upper portion shows a flow path. In the upper portion, (1) is a case in which the vapor depositing source 202 and the chamber 201 are conducted to each other to block entrance into the recovery container 203, (2) is a case in which the vapor depositing source 202 and the recovery container 203 are conducted to each other to block entrance into the chamber 201, and (3) is a case in which the recovery container 203 and the chamber 201 are conducted to each other to block entrance into the vapor depositing source 202. The lower portion of the drawing shows the released amount of a vapor deposition material released from a release port 205. In the drawing, A and E indicate vapor deposition material releasing steps, and B and F indicate vapor deposition recovering steps. In this case, the upper portion of FIG. 1 is shown.

Referring to FIG. 7, the changes over time in the flow path switching timing of the three-way valve 601 and the released amount of a vapor deposition material will be described. In FIG. 7, for a step I, a relation of changes over time between the flow path switching timing of the three-way valve 601 and the released amount of a vapor deposition amount is similar to that of the first embodiment. Next, a case in which the recovery container 203 is used as a vapor deposition source will be described from $B_n$ of a step II of the drawing.

After the vapor deposition material releasing step is carried out by n times in the period of I of the drawing, the vapor deposition material recovering step is carried out ($B_n$). In the meantime, a flow path is in a state of (2). During this period, heating of the vapor depositing source 202 is suspended to lower a temperature to a fixed level. A vapor deposition material deposited in the recovery container 203 is heated by the recovery container heating means 603 to evaporate. The evaporated vapor deposition material flows into the vapor depositing source 202 which has heated the vapor deposition material to evaporate.

Next, vapor deposition is carried out on a substrate 212 ($E_1$). In the meantime, a flow path is in a state of (3). The vapor deposition material heated in the recovery container 203 is released into the chamber 201. The released amount of a vapor deposition material gradually increases after a flow path becomes a state of (3), and it takes time until the released amount is stabilized ($G_1$, $G_2$, ... in the drawing).

Upon an end of the vapor deposition on the substrate 212, the vapor deposition material flows again into the vapor depositing source 202 ($F_1$). In the meantime, a flow path is in a state of (2), and the recovery container 203 is sealed to the chamber 201. During this period, the recovery container 203 is continuously heated, and the vapor deposition material evaporated in the recovery container 203 flows through the transfer path 204 into the vapor depositing source 202. As the vapor deposition material remains in the pipe 602 even after the flow path becomes a state of (2), it takes time until this vapor deposition material is released and no more vapor deposition material is released. The substrate 212 is changed to another substrate (not shown) during the period of $F_1$ or simultaneously, and the another substrate is held by a substrate holder 214.

Then, a flow path is set again in the state of (3), and the vapor deposition is carried out ($E_2$). Upon an end of the vapor deposition, a flow path is set in the state of (2) causing the vapor deposition material to flow into the vapor depositing source 202. The same process is repeated thereafter.

The other components should preferably be similar to those of the vapor deposition method of the first embodiment.

Third Embodiment

In a vapor deposition system of this embodiment, a transfer path 204 for interconnecting a release port 205 and a recovery container opening 208 is movable.

Figure 8:
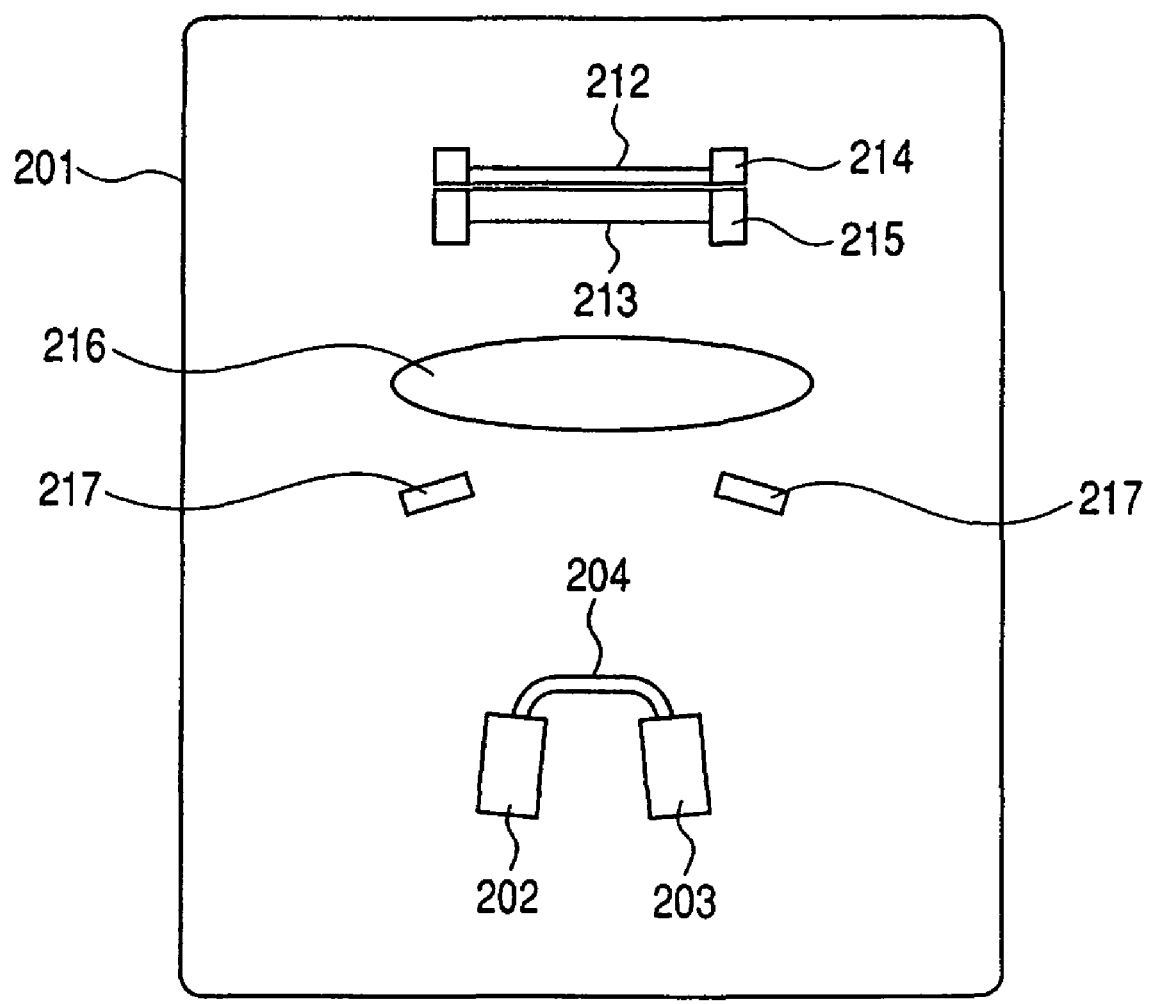
FIG. 8 is a schematic diagram showing a vapor deposition system according to a third embodiment of the present invention.
Figure 9:
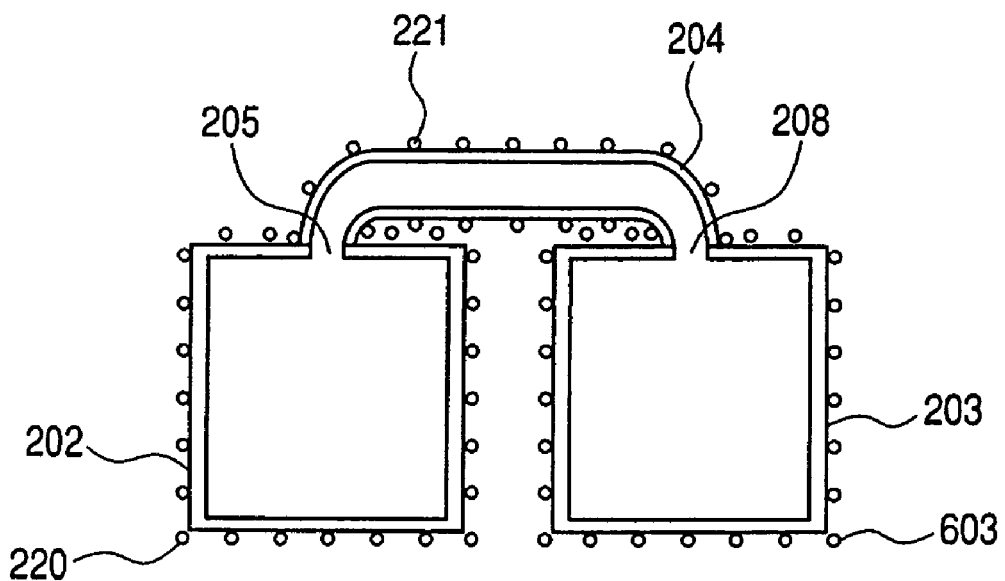
FIG. 9 is a schematic sectional diagram when a vapor depositing source, a recovery container, and a transfer path of the vapor deposition system of the third embodiment of the present invention are seen from a side face.
Figure 10:
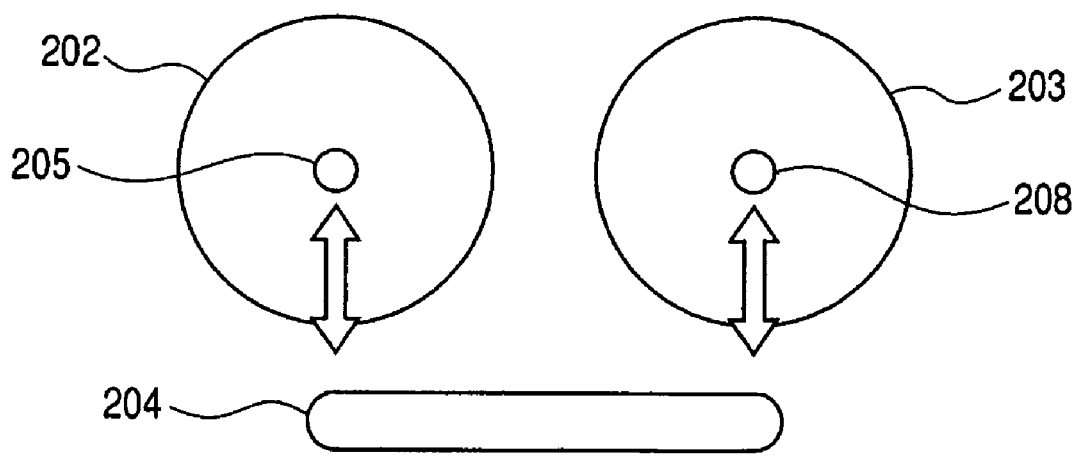
FIG. 10 is a schematic diagram when the vapor depositing source, the recovery container, and the transfer path of the vapor deposition system of the third embodiment of the present invention are seen from a top.

FIG. 8 is a schematic diagram showing the vapor deposition system of the embodiment. FIG. 9 is a schematic sectional diagram when a vapor depositing source 202, a recovery container 203, and the transfer path 204 are seen from a side face. FIG. 10 is a schematic diagram when the vapor depositing source 202, the recovery container 203, and the transfer path 204 are seen from a top. The components the same as those of FIGS. 2 and 6 are denoted by the same reference numerals, and description thereof will be omitted.

The transfer path 204 is provided above the vapor depositing source 202 to interconnect the release port 205 and the recovery container opening 208, and the vapor depositing source 202 and the recovery container 203 are conducted to each other through the transfer path 204. The transfer path 204 is moved by driving means (not shown), and is enabled to retreat from a portion between the release port 205 or the recovery container opening 208 and a substrate 212. For example, according to the embodiment, as shown in FIG. 10, the transfer path is shifted in a horizontal direction to retreat from the portion between the release port 205 or the recovery container opening 208 and the substrate 212.

Two flow paths can be switched by moving the transfer path 204. A first path is a path in which the vapor depositing source 202, the recovery container 203, and a chamber 201 are conducted to one another while the vapor depositing source 202 and the recovery container 203 are not conducted to each other through the transfer path 204 (flow path (4)). A second path is a path in which the vapor depositing source 202 and the recovery container 203 are sealed to the chamber 201, and the vapor depositing source 202 and the recovery container 203 are conducted to each other (flow path (5)).

In the case of the flow path (4), a vapor deposition material heated in the vapor depositing source 202 can be released into the chamber 201. A vapor deposition material recovered in the recovery container 203 can be heated to be released into the chamber 201.

In the case of the flow path (5), the vapor deposition material heated in the vapor depositing source 202 can flow into the recovery container 203, or the vapor deposition material heated in the recovery container 203 can flow into the vapor depositing source 202. As the vapor depositing source 202 and the recovery container 203 are sealed to the chamber 201, continuous leakage of the vapor deposition material evaporated in the vapor depositing source 202 or in the recovery container 203 into the chamber 201 is always prevented.

The other components should preferably be similar to those of the vapor deposition system of the first or second embodiment.

Next, a vapor deposition method of the embodiment will be described. In addition, a vapor deposition method when the recovery container 203 is used as a vapor depositing source will be described.

Figure 11:
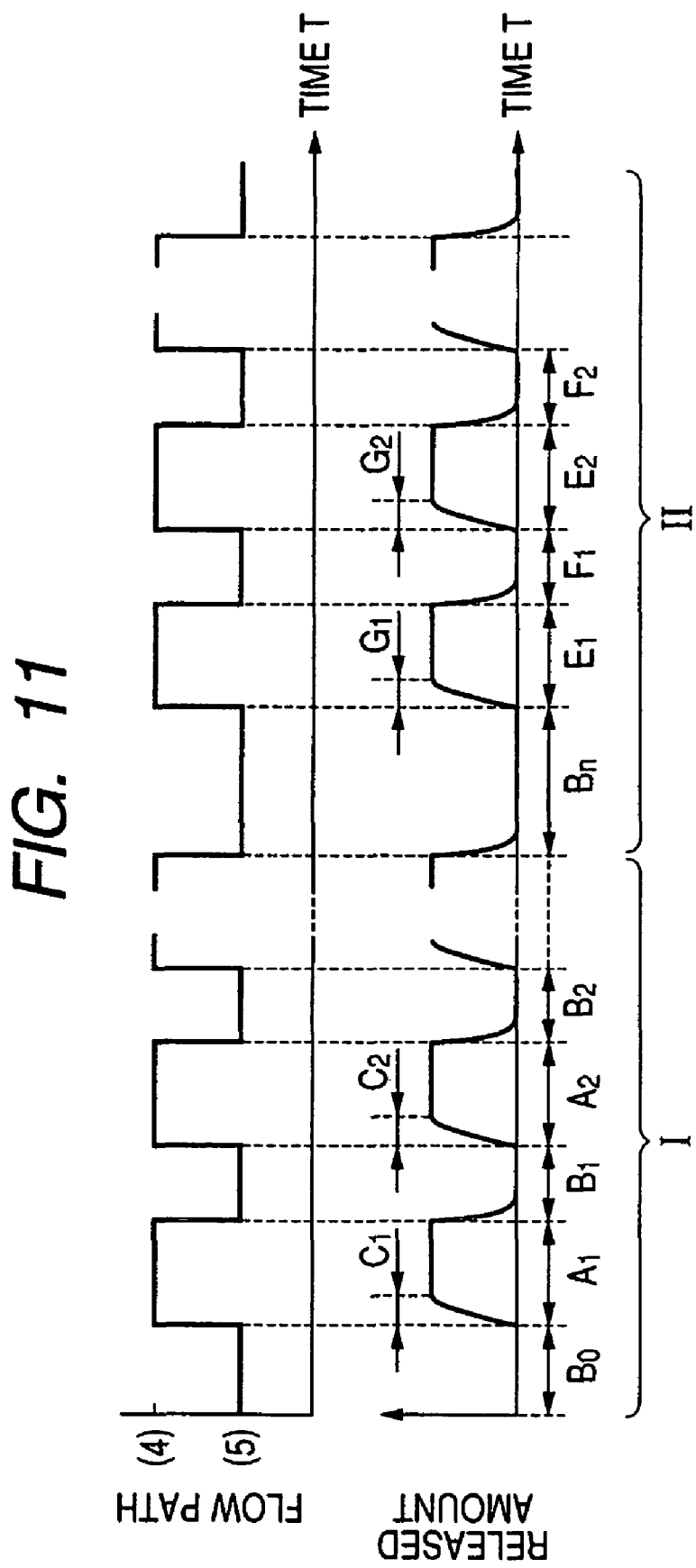
FIG. 11 is a diagram showing a relation between an opening/closing operation of flow path switching means of a vapor deposition method and a released amount according to the third embodiment of the present invention.

Regarding the vapor deposition method of the embodiment, FIG. 11 is an explanatory diagram showing changes over time in movement timing of the transfer path 204 and the released amount of a vapor deposition material. The upper portion of the drawing shows a flow path. In the upper portion, (4) is a case in which the vapor depositing source 202 and the recovery container 203 are open to the chamber 201, and (5) is a case in which the vapor depositing source 202 and the recovery container 203 are sealed to the chamber 201, and the vapor depositing source 202 and the recovery container 203 are conducted to each other. The lower portion of the drawing shows the released amount of a vapor deposition material released from the release port 205 or the recovery container opening 208. In the drawing, A and E indicate vapor deposition material releasing steps and B and F indicate vapor deposition recovering steps. In this case, the upper portion of FIG. 1 is shown.

Referring to FIG. 11, the changes over time in the movement timing of the transfer path 204 and the released amount of a vapor deposition material will be described. In FIG. 11, for a step I, a relation of changes over time between the movement timing of the transfer path 204 and the released amount of a vapor deposition amount is similar to that of the first embodiment. Next, a case in which the recovery container 203 is used as a vapor deposition source will be described from $B_n$ of a step II of the drawing.

After the vapor deposition material releasing step is carried out by n times in the period of I of the drawing, the vapor deposition material recovering step is carried out ($B_n$). In the meantime, a flow path is in a state of (5), and the recovery container 203 and the vapor depositing source 202 are sealed to the chamber 201. During this period, heating of the vapor depositing source 202 is suspended to lower a temperature to a fixed level. A vapor deposition material deposited in the recovery container 203 is heated by recovery container heating means to evaporate. The evaporated vapor deposition material flows into the vapor depositing source 202 which has heated the vapor deposition material to evaporate.

Next, vapor deposition is carried out on a substrate 212 ($E_1$). In the meantime, a flow path is in a state of (4). The vapor deposition material heated in the recovery container 203 is released into the chamber 201. The released amount of a vapor deposition material gradually increases after a flow path becomes a state of (4), and it takes time until the released amount is stabilized ($G_1, G_2, \ldots$ in the drawing).

Upon an end of the vapor deposition on the substrate 212, the vapor deposition material flows again into the vapor depositing source 202 ($F_1$). In the meantime, a flow path is in a state of (5). During this period, the recovery container 203 is continuously heated, and the vapor deposition material evaporated in the recovery container 203 flows through the transfer path 204 into the vapor depositing source 202. The substrate 212 is changed to another substrate (not shown) during the period of $F_1$ or simultaneously, and the another substrate is held by a substrate holder 214.

Then, a flow path is set again in the state of (4), and vapor deposition is carried out ($E_2$). Upon an end of the vapor deposition, a flow path is set in the state of (5) causing the vapor deposition material to flow into the vapor depositing source 202. The same process is repeated thereafter.

The other components should preferably be similar to those of the vapor deposition method of the first or second embodiment.

EXAMPLE 1

This example is directed to a case in which a process is carried out by the vapor deposition system and the vapor deposition method of the first embodiment.

Alq 3 was fed as a vapor deposition material by 3 g in the vapor depositing source 202 shown in FIG. 2, and a quartz glass substrate was installed as a substrate 212. A distance from the release port 205 to a vapor deposition surface of the substrate 212 was set to 200 mm. For a mask 213, a mask having a rectangular opening of 100×200 µm added to stainless foil in a zigzag manner was used.

First, the chamber 201 and the vapor depositing source 202 were evacuated to 1E-5pa, and then the heater 220 of the vapor depositing source 202 was energized for heating to increase a temperature of the vapor depositing source 202 to 280° C. The cover 210 was set in a position to cover the opening 206, and the vapor depositing source 202 was sealed to the chamber 201. The recover container 203 was held by a water-cooling jacket which was cooling means 219. After the vapor depositing source 202 reached 280° C., it was left for 30 minutes so that the cover 210 could become equal in temperature to the vapor depositing source 202.

Subsequently, the cover 210 was set in a position to cover the vapor deposition material inlet 207. The crystal resonator film thickness sensor 217 confirmed that a vapor deposition speed was stable at 1±0.1 nm/sec., and the shutter 216 was opened to start vapor deposition.

When the crystal resonator film thickness sensor 217 observed a film formed with 50 nm, the shutter 216 was closed, and the cover 210 was simultaneously set in a position to cover the opening 206. An Alq 3 gas evaporated in the vapor depositing source 202 was recovered in the recovery container 203 maintained at a room temperature, and cooled to be solidified again. Subsequently, the substrate 212 was moved into an adjacent vacuum chamber (not shown), another substrate was installed in the substrate holder 214, and its position was checked with respect to the mask 213.

Then, the cover 210 was set in a position to cover the vapor deposition material inlet 207. It was confirmed by the crystal resonator film thickness sensor 217 that a vapor deposition speed was stable at 1±0.1 nm/sec., and the shutter 216 was opened to start vapor deposition again.

Time taken from the end of the first vapor deposition to the start of second vapor deposition was about 30 seconds. It was then found that when the same process was repeated to perform vapor deposition by 120 times, the vapor deposition speed indicated by the crystal resonator film thickness sensor 217 started to decline, and the vapor depositing source 202 became empty.

Subsequently, the heating of the vapor depositing source 202 was stopped to lower a temperature to the vicinity of a room temperature, and the amount of Alq 3 that has flown into the recovery container 203 to be deposited was measured. A result was 1.75 g. As a ratio of vapor deposition time and vapor deposited time was 50 seconds: 30 seconds, if Alq 3 subjected to no deposition was all recovered, it was calculated to be 1.8 g. Considering a time loss and the like until stabilization of the vapor deposition, nearly all was recovered.

EXAMPLE 2

This example is directed to a case in which a process is carried out by the vapor deposition system and the vapor deposition method of the second embodiment.

Alq 3 was fed as a vapor deposition material by 3 g in the vapor depositing source 202 shown in FIG. 6, and a quartz glass substrate was installed as a substrate 212. A distance from the release port 205 to a vapor deposition surface of the substrate 212 was set equal to that of the first embodiment, i.e., 200 mm. For a mask 213, a mask having a rectangular opening of 100×200 µm added to stainless foil in a zigzag manner was used.

First, the chamber 201, the vapor depositing source 202, and the recover container 203 were evacuated to 1E-5pa, and then the heater 220 of the vapor depositing source 202 was energized for heating to increase a temperature of the vapor depositing source 202 to 280° C. In this case, the heater was energized for heating to increase temperatures of the transfer path 204, the three-way valve 601, and the pipe 602 to 280° C. The three-way valve 601 was set so that the vapor depositing source 202 and the recovery container 203 were conducted to seal the vapor depositing source 202 to the chamber 201. The recover container 203 was not increased in temperature but left at a room temperature.

The three-way valve 601 was set to conduct the vapor depositing source 202 and the chamber 201 to each other 30 minutes after the vapor depositing source 202, the transfer path 204, the three-way valve 601, and the pipe 602 reached 280° C. Then, the crystal resonator film thickness sensor 217 confirmed that a vapor deposition speed was stable at 1±0.1 nm/sec., and the shutter 216 was opened to start vapor deposition.

When the crystal resonator film thickness sensor 217 observed a film formed with 50 nm, the shutter 216 was closed. Simultaneously, the three-way valve 601 was set to conduct the vapor depositing source 202 and the recovery container 203 to each other. An Alq 3 gas evaporated in the vapor depositing source 202 was recovered in the recovery container 203 not increased in temperature, and cooled to be solidified again. Subsequently, the substrate 212 was moved into an adjacent vacuum chamber (not shown), another substrate was installed in the substrate holder 214, and its position was checked with respect to the mask 213. Then, the three-way valve 601 was set to conduct the vapor depositing source 202 and the chamber 201 to each other.

It was confirmed by the crystal resonator film thickness sensor 217 that a vapor deposition speed was stable at 1±0.1 nm/sec., and the shutter 216 was opened to start vapor deposition again.

Time taken from the end of the first vapor deposition to the start of second vapor deposition was equal to that of the Example 1 , i.e., about 30 seconds. It was then found that when the same process was repeated to perform vapor deposition by 120 times, the vapor deposition speed indicated by the crystal resonator film thickness sensor 217 started to decline, and the vapor depositing source 202 became empty.

Subsequently, the three-way valve 601 was set to conduct the vapor depositing source 202 and the recovery container 203 to each other, the heating of the vapor depositing source 202 was stopped to lower a temperature to the vicinity of a room temperature, and the heating means 603 of the recovery container 203 was energized for heating to increase a temperature of the recovery container 203 to 280° C. During this period, the transfer path 204, the three-way valve 601, and the pipe 602 were kept at 280° C.

The three-way valve 601 was set to conduct the recovery container 203 and the chamber 201 to each other 30 minutes after the recovery container 203 reached 280° C. It was confirmed by the crystal resonator film thickness sensor 217 that a vapor deposition speed was stable at 1±0.1 nm/sec., and the shutter 216 was opened to start vapor deposition.

Thereafter, the same process as that of the vapor deposition carried out by using the vapor depositing source 202 ware repeated. It was found that after the vapor deposition was executed by 30 times, the vapor deposition speed indicated by the crystal resonator film thickness sensor 217 started to decline, and the recovery container 203 became empty.

EXAMPLE 3

This example is directed to a case in which a process is carried out by the vapor deposition system and the vapor deposition method of the third embodiment.

Alq 3 was fed as a vapor deposition material by 3 g in the vapor depositing source 202 shown in FIG. 8, and a quartz glass substrate was installed as a substrate 212. A distance from the release port 205 to a vapor deposition surface of the substrate 212 was set to 200 mm. For a mask 213, a mask having a rectangular opening of 100×200 μm added to stainless foil in a zigzag manner was used.

First, the inside of the chamber 201 was evacuated to 1E-5pa, and then the heater 220 of the vapor depositing source 202 was energized for heating to increase a temperature of the vapor depositing source 202 to 280° C. In this case, the transfer path 204 was set to conduct the release port 205 and the recovery container opening 208 to each other, and the transfer path heating means 221 was energized for heating to increase its temperature equal to that of the vapor depositing source 202. The recovery container 203 was not increased in temperature but kept at a room temperature.

As shown in FIG. 10, the transfer path 204 was moved from the release port 205 and the recovery container opening 208, 30 minutes after the vapor depositing source 202 and the transfer path 204 reached 280° C. The crystal resonator film thickness sensors 217 confirmed that a vapor deposition speed was stable at 1±0.1 nm/sec., and the shutter 216 was opened to start vapor deposition.

When the crystal resonator film thickness sensors 217 observed a film formed with 50 nm, the shutter 216 was closed. Simultaneously, the transfer path 204 was moved to the release port 205 and the recovery container opening 208 to conduct the vapor depositing source 202 and the recovery container 203 to each other, and an Alq 3 gas evaporated in the vapor depositing source 202 was recovered in the recovery container 203 not increased in temperature, and cooled to be solidified again. Subsequently, the substrate 212 was moved into an adjacent vacuum chamber (not shown), another substrate was installed in the substrate holder 214, and its position was checked with respect to the mask 213. Then, the transfer path 204 was moved again to the position shown in FIG. 10.

It was confirmed by the crystal resonator film thickness sensors 217 that a vapor deposition speed was stable, and the shutter 216 was opened to start vapor deposition.

Time taken from the end of the first vapor deposition to the start of second vapor deposition was about 30 seconds. It was then found that when the same process was repeated to perform vapor deposition by 110 times, the vapor deposition speed indicated by the crystal resonator film thickness sensors 217 started to decline, and the vapor depositing source 202 became empty.

Subsequently, the vapor depositing source 202 and the recovery container 203 were conducted to each other through the transfer path 204, and the heating of the vapor depositing source 202 was stopped to lower a temperature to the vicinity of a room temperature. The recovery container heating means 603 was energized for heating to increase a temperature to 280° C. During this period, the transfer path 204 was kept at 280° C.

The transfer path 204 was moved to the position shown in FIG. 10, 30 minutes after the recovery container 203 reached 280° C., the crystal resonator film thickness sensors 217 confirmed that a vapor deposition speed was stable at 1±0.1 nm/sec., and the shutter 216 was opened to start vapor deposition.

Thereafter, the same process as that of the vapor deposition carried out by using the vapor depositing source 202 was repeated. It was found that after the vapor deposition was carried out by 25 times, a vapor deposition speed indicated by the crystal resonator film thickness sensors 217 started to decline, and the recovery container 203 became empty.

This application claims priority from Japanese Patent Application No. 2005-179262 filed on Jun. 20, 2005, which is hereby incorporated by reference herein.

What is claimed is:

1. A vapor deposition system comprising:
   a chamber;
   a vapor depositing source;
   a recovery container;
   a transfer path for connecting the vapor depositing source to the recovery container; and
   a flow path switching unit for switching between a first flow path for releasing a vapor deposition material evaporated from the vapor depositing source into the chamber and a second flow path for causing the vapor deposition material evaporated from the vapor depositing source to flow from the vapor depositing source through the transfer path into the recovery container,
   wherein the first flow path is conducted to the vapor depositing source by an opening at one end of the first flow path, the opening disposed on an upper portion of the vapor depositing source;
   the transfer path is conducted to the vapor depositing source by a vapor deposition material inlet at one end of the transfer path, the vapor deposition material inlet disposed on a side wall of the vapor depositing source;
   the flow path switching unit is a cover hinged on and rotated around a shaft and is disposed in the vapor depositing source; and
   when the cover covers the vapor deposition material inlet, the transfer path is cut off, whereby the vapor deposition material flows into the first flow path, and when the cover covers the opening, the first flow path is cut off, whereby the vapor deposition material flows into the second flow path through the transfer path.

2. The vapor deposition system according to claim 1, wherein conductance until releasing of the vapor deposition material evaporated from the vapor depositing source into the chamber and conductance until reception of the vapor deposition material evaporated from the vapor depositing source in the recovery container are equal to each other.

* * * * *